(12) United States Patent
Song et al.

(10) Patent No.: US 10,326,076 B2
(45) Date of Patent: Jun. 18, 2019

(54) METHOD OF MANUFACTURING DISPLAY SUBSTRATE, DISPLAY SUBSTRATE AND DISPLAY DEVICE

(71) Applicant: BOE TECHNOLOGY GROUP CO., LTD., Beijing (CN)

(72) Inventors: Yingying Song, Beijing (CN); Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/914,173

(22) PCT Filed: Sep. 16, 2015

(86) PCT No.: PCT/CN2015/089718
§ 371 (c)(1),
(2) Date: Feb. 24, 2016

(87) PCT Pub. No.: WO2016/165274
PCT Pub. Date: Oct. 20, 2016

(65) Prior Publication Data
US 2016/0300897 A1    Oct. 13, 2016

(30) Foreign Application Priority Data

Apr. 13, 2015   (CN) .......................... 2015 1 0174031

(51) Int. Cl.
*H01L 51/00* (2006.01)
*H01L 27/32* (2006.01)

(52) U.S. Cl.
CPC ........ *H01L 51/004* (2013.01); *H01L 51/0016* (2013.01); *H01L 51/0026* (2013.01); *H01L 27/3246* (2013.01); *H01L 27/3276* (2013.01)

(58) Field of Classification Search
CPC .......................... H01L 51/0004; H01L 51/56; H01L 51/524; H01L 51/0011; H01L 27/3246;
(Continued)

(56) References Cited

U.S. PATENT DOCUMENTS 6,306,559 B1 * 10/2001 Tanamura ........... H01L 27/3246
313/504
6,911,773 B2 * 6/2005 Seki ..................... H01L 27/3246
313/498

(Continued)

FOREIGN PATENT DOCUMENTS

CN    103270816 A    8/2013
CN    103283306 A    9/2013
(Continued)

OTHER PUBLICATIONS

Search Report and Written Opinion dated Jan. 11, 2016 from State Intellectual Property Office of the P.R. China.
Chinese Office Action dated Dec. 1, 2015.

*Primary Examiner* — Khiem D Nguyen
(74) *Attorney, Agent, or Firm* — Dilworth & Barrese, LLP.; Michael J. Musella, Esq.

(57) ABSTRACT

A method of manufacturing a display substrate, a display substrate and a display device are provided. The manufacturing method includes: forming an organic material layer in a display area (10) and a non-display area (11); forming an auxiliary layer (24, 25) in the non-display area (11) before forming the organic material layer. The performances of the auxiliary layer (24, 25) are changed after heating, to allow a portion of the organic material layer corresponding to the auxiliary layer (24, 25) can be easily stripped off. The method further includes removing the portions of the organic material layer corresponding to the auxiliary layer by a heating process.

19 Claims, 3 Drawing Sheets

(58) Field of Classification Search
CPC ........... H01L 2227/323; H01L 27/3258; H01L 51/0016; H01L 27/3223; H01L 51/5243; H01L 51/5246; H01L 51/5253–5256; H01L 27/3244; H01L 27/3251; H01L 27/3276

See application file for complete search history.

(56) References Cited

U.S. PATENT DOCUMENTS

| | | | | |
|---|---|---|---|---|
| 7,385,347 B2* | 6/2008 | Song | ................... | H01L 51/5246 313/504 |
| 9,412,969 B2* | 8/2016 | Kim | ................... | H01L 51/5056 |
| 2005/0116620 A1* | 6/2005 | Kobayashi | .......... | H01L 51/5271 313/503 |
| 2009/0009069 A1* | 1/2009 | Takata | ................ | H01L 27/3246 313/504 |
| 2009/0098680 A1* | 4/2009 | Tsai | ................... | H01L 27/3246 438/99 |
| 2010/0213819 A1* | 8/2010 | Cok | ................... | H01L 27/3255 313/498 |
| 2012/0132930 A1* | 5/2012 | Young | ................ | H01L 31/0481 257/84 |
| 2012/0292645 A1* | 11/2012 | Park | ................... | H01L 27/1225 257/88 |
| 2013/0295705 A1* | 11/2013 | Sonoda | ............... | H01L 51/0011 438/34 |
| 2015/0014636 A1* | 1/2015 | Kang | ................ | H01L 51/5253 257/40 |
| 2015/0102314 A1* | 4/2015 | Choi | ................... | H01L 27/3246 257/40 |

FOREIGN PATENT DOCUMENTS

| | | | | |
|---|---|---|---|---|
| CN | 103515413 A | | 1/2014 | |
| CN | 104269494 A | * | 1/2015 | ............ H01L 27/32 |
| CN | 104269494 A | | 1/2015 | |
| CN | 104779200 A | | 7/2015 | |
| JP | 2000-164353 A | * | 6/2000 | ............ H05B 33/10 |
| JP | 2000164353 A | | 6/2000 | |

\* cited by examiner

METHOD OF MANUFACTURING DISPLAY SUBSTRATE, DISPLAY SUBSTRATE AND DISPLAY DEVICE

TECHNICAL FIELD

Embodiments of the present disclosure relate to a method of manufacturing a display substrate, a display substrate and a display device.

BACKGROUND

Organic light-emitting diode (OLED) technology has been considered as one of the most competitive next-generation emission and display technology. However, in the application of display devices, OLED display devices face great challenge in large scale and mass production since the commercialization of polymer organic light-emitting diode (PLOED) display devices released by Pioneer in 1996.

SUMMARY

Embodiments of the present disclosure provide a method of manufacturing a display substrate, a display substrate and a display device.

The technical solution adopted by the embodiment of the present disclosure is the method of manufacturing the display substrate. The display substrate includes a display area and a non-display area. The manufacturing method includes: a step of forming an organic material layer in the display area and the non-display area; a step of forming an auxiliary layer in the non-display area before forming the organic material layer; and a step of removing a portion of the organic material layer corresponding to the auxiliary layer by a heating process.

In an example, the auxiliary layer is made from material of which the temperature is raised after heating or which is deformed after heating or which the viscosity is reduced after heating.

In an example, before the organic material layer is formed, a thin-film transistor (TFT) layer including a plurality of TFTs disposed in the display area and being extended to the non-display area is formed and a pixel definition layer (PDL) is formed on the TFT layer; and the organic material layer in the display area is formed in the PDL so as to form OLEDs.

In an example, the auxiliary layer includes a first auxiliary layer and/or a second auxiliary layer; the first auxiliary layer is made from heat-absorbing material and formed below the TFT layer in the non-display area; and the second auxiliary layer is made from thermoplastic polymer material or thermal expansion material and formed on the PDL in the non-display area.

In an example, the step of forming the TFT layer includes: forming patterns of gate electrodes, gate lines, active layers, source electrodes and drain electrodes; the gate electrodes and the gate lines are formed by a same gate metal material layer through a patterning process; and the pattern of the active layers and the pattern of the source electrodes and the drain electrodes are formed in sequence on the gate electrodes and the gate lines.

In an example, the PDL is formed in a shape of gridding in the display area; the step of forming the OLEDs at least includes: forming a pattern of a first electrode layer disposed in the gridding of the PDL, a second electrode layer covering the PDL and a pattern of an emission layer (EML) disposed between the pattern of the first electrode layer and the second electrode layer; and the first electrode layer is electrically connected with the TFTs.

In an example, the heat-absorbing material includes metal with strong heat absorptivity or metal oxide with strong heat absorptivity, in which the metal with strong heat absorptivity is selected from a group consisting of black titanium, or black chrome, and the metal oxide with strong heat absorptivity is selected from a group consisting of aluminum oxide, titanium oxide, manganese oxide, copper oxide, or the like.

In an example, the thermoplastic polymer material is selected from a group consisting of polypropylene (PP), polyethylene (PE) and polyvinyl chloride (PVC); and the thermal expansion material is selected from a group consisting of zinc, lead, magnesium, aluminum or an alloy of at least one above metal.

In an example, the organic material layer is simultaneously formed in the display area and the non-display area by continuous printing or a coating process and includes at least one organic material for forming the OLEDs.

In an example, the first auxiliary layer is formed below the TFT layer in the non-display area by a patterning process; and the second auxiliary layer is bonded to the upper part of the PDL in the non-display area via a viscous medium.

In an example, the step of removing the portion of the organic material layer corresponding to the auxiliary layer by a heating process includes: heating the display substrate by illuminating process, thermoelastic process or thermal ablation process.

A display substrate includes a display area and a non-display area. An organic material layer is disposed in the display area and the non-display area; an auxiliary layer is disposed in the non-display area; and the performances of the auxiliary layer are changed after heating, to allow a portion of the organic material layer corresponding to the auxiliary layer being easily stripped off.

In an example, the auxiliary layer is made from material of which the temperature is raised after heating or which is deformed after heating or which the viscosity is reduced after heating.

In an example, the display substrate includes a TFT layer including a plurality of TFTs disposed in the display area and being extended to the non-display area and a pixel definition layer (PDL) disposed on the TFT layer; and the organic material layer in the display area is disposed in the PDL so as to form OLEDs.

In an example, the auxiliary layer includes a first auxiliary layer and/or a second auxiliary layer; the first auxiliary layer is made from heat-absorbing material and disposed below the TFT layer in the non-display area; and the second auxiliary layer is made from thermoplastic polymer material or thermal expansion material and disposed on the PDL in the non-display area.

In an example, the TFT layer includes: a pattern of gate electrodes and a pattern of gate lines, a pattern of active layers, and a pattern of source electrodes and drain electrodes; and the pattern of the active layers and the pattern of the source electrodes and the drain electrodes are disposed on the pattern of the gate electrodes and the pattern of the gate lines in sequence.

In an example, the PDL is formed in a shape of gridding in the display area; the OLEDs at least include: a pattern of a first electrode layer disposed in the gridding of the PDL, a pattern of a second electrode covering the PDL, and a pattern of an EML disposed between the first electrode layer and the second electrode layer; and the first electrode layer is electrically connected with the TFTs.

In an example, the heat-absorbing material includes metal with strong heat absorptivity or metal oxide with strong heat absorptivity. The metal with strong heat absorptivity is selected from a group consisting of black titanium or black chrome, and the metal oxide with strong heat absorptivity is selected from a group consisting of aluminum oxide, titanium oxide, manganese oxide, copper oxide, or the like.

In an example, the thermoplastic polymer material includes: PP, PE and PVC; and the thermal expansion material includes zinc, lead, magnesium, aluminum or an alloy of at least one above metal.

A display device includes the display substrate.

DETAILED DESCRIPTION

Figure 1:
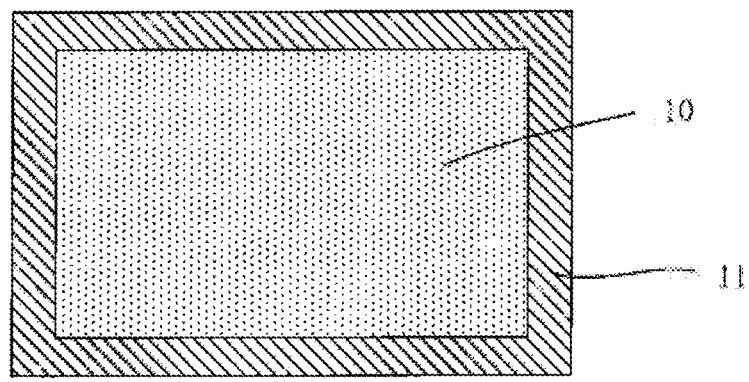
FIG. 1 is a schematic diagram illustrating the division of a display area and a non-display area of a display substrate provided by an embodiment of the present disclosure.

Technical solutions according to the embodiments of the present disclosure will be described clearly and completely as below in conjunction with the accompanying drawings of embodiments of the present disclosure. It is apparent that the described embodiments are only a part of but not all of exemplary embodiments of the present disclosure. Based on the described embodiments of the present disclosure, various other embodiments and variants can be obtained by those of ordinary skill in the art without creative labor and those embodiments and variants shall fall into the protection scope of the present disclosure.

Unless otherwise defined, all the technical and scientific terms used herein have the same meanings as commonly understood by one of ordinary skill in the art to which the present disclosure belongs. The terms, such as "first," "second" or the like, which are used in the description and the claims of the present application, are not intended to indicate any sequence, amount or importance, but for distinguishing various components. Also, the terms, such as "a/an," "one," "the/said" or the like, are not intended to limit the amount, but for indicating the existence of at lease one. The terms, such as "comprise/comprising," "include/including" or the like, are intended to specify that the elements or the objects stated before these terms encompass the elements or the objects and equivalents thereof listed after these terms, but not preclude other elements or objects. The terms, such as "On," "under," or the like, are only used to indicate relative position relationship, and when the position of the object which is described is changed, the relative position relationship may be changed accordingly.

The inventors notice that the manufacturing process of organic materials mainly includes vapor depositing process and solution process. In the case of large-scale substrates, vacuum thermal evaporation technology has great deficiency. For example, a light-shielding plate tends to be deviated due to the high-temperature environment in the manufacturing process, and hence uniform deposition rate cannot be maintained on the substrates. As for inkjet printing technology, as a thin-film layer may be formed by the uniform deposition of liquid organic material, the problem of large scale can be better solved in theory.

Inkjet printing includes continuous printing and non-continuous printing. Continuous printing process belongs to non-mask and non-contact manufacturing process. It has advantages of successive printing, the capability of continuously and stably jetting out ink without blocking nozzles due to large aperture, high yield, easy realization of large scale and large degree of freedom of ink composition, and it has the deficiency that in the manufacturing process of continuous printing (or printing), the non-display area (also referred to as an exceptional area, namely a portion except a display area) portion must be subjected to additional material cleaning, which is the limitation of the manufacturing process. In addition, the more mature coating technology may also be applied in the display field and also has the problem of cleaning the non-display area.

To solve the problem of cleaning organic materials of the non-display area of the display substrate, possible methods include plasma dry etching method, laser cleaning method, wiping method or the like. But the above methods always have some problems as for the conventional substrates. For example, some structures on the substrate are damaged due to too strong energy, or the cleaning process is incomplete due to lack of energy or unequal energy applied.

Further detailed description will be given below to the method of manufacturing the display substrate, the display substrate and the display device in conjunction with the accompanying drawings and the preferred embodiments.

In the display substrate as shown in FIG. 1, an area corresponding to a display area 10 is provided with a TFT layer and OLEDs to form an entity for image display. An area corresponding to a non-display area 11 is provided with a drive circuit for achieving the image display of the display area 10 and providing data support circuit for image display. In the manufacturing process of the display substrate, layers made from same materials in the display area 10 and the non-display area 11 generally adopt a same film forming process, and subsequently, a pattern of the display area 10 and the non-display area 11 is formed by patterning processes. In an OLED display device, as organic materials for forming OLEDs are simultaneously formed in the display area 10 and the non-display area 11, as for a cathode contact area, a package area and a circuit board connection area in the non-display area 11, the organic materials in the non-display area 11 must also be removed after the OLEDs are formed, to avoid affecting the performances of the display substrate.

In the embodiment of the present disclosure, an auxiliary layer is additionally arranged in the non-display area 11. The performances of the auxiliary layer are changed under heating state, so that the organic materials in the non-display area 11 can be more easily stripped off, so the organic materials in the non-display area 11 can be more easily cleaned.

Embodiments of the present disclosure provide a method of manufacturing a display substrate. The display substrate includes a display area and a non-display area. The manufacturing method includes a step of forming an organic material layer in the display area and the non-display area. The method further includes: forming an auxiliary layer in the non-display area before forming the organic material layer, in which the auxiliary layer has the following features: the performances of the auxiliary layer are changed after heating, so that a portion of the organic material layer corresponding to the auxiliary layer can be easily stripped off; and removing the portion of the organic material layer corresponding to the auxiliary layer by a heating process.

The auxiliary layer is made from material of which the temperature is raised after heating or which is deformed after heating or which the viscosity is reduced after heating. The changes of the performances of the auxiliary layer after heating include: the temperature of the auxiliary layer is raised after heating, or the auxiliary layer is deformed after heating, or the viscosity of the auxiliary layer is reduced after heating.

The method of, manufacturing the display substrate provided by the embodiment of the present disclosure, can effectively and rapidly remove the portion of the organic material layer in the non-display area corresponding to the auxiliary layer and greatly improves the manufacturing efficiency of the display substrate and reduces the manufacturing cost.

Embodiment 1:

The embodiment provides a method of manufacturing a display substrate and a display substrate formed by the manufacturing method.

Figure 2:
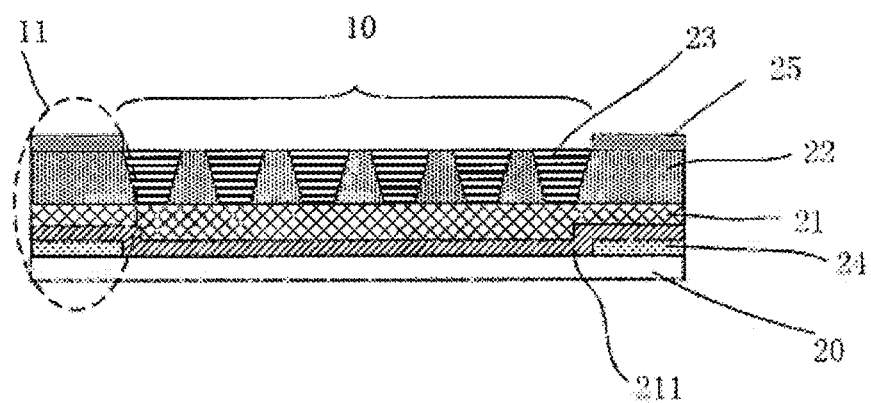
FIG. 2 is a schematic partial structural view of a display substrate provided by the first embodiment of the present disclosure.
Figure 5:
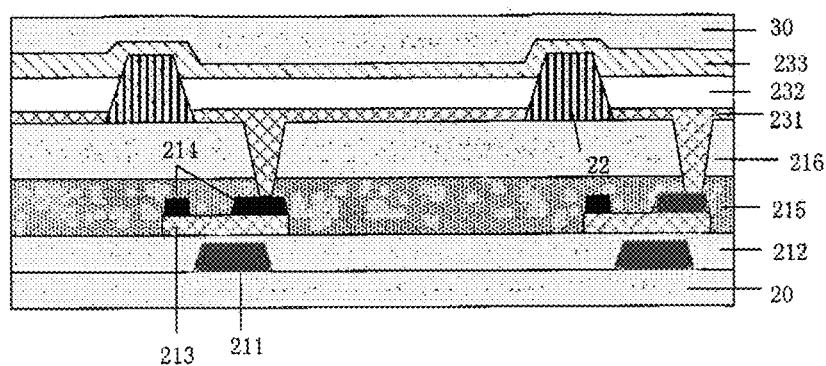
FIG. 5 is a schematic partial structural view of a display substrate provided by an embodiment of the present disclosure, in which TFTs and OLEDs are displayed.

As illustrated in FIGS. 1 and 2, the display substrate includes a display area 10 and a non-display area 11 (also referred to as an exceptional area). The display area is divided into a plurality of pixel regions, and a sub-pixel unit is formed in each pixel region. In an OLED display device, each sub-pixel unit includes an OLED and a TFT configured to control the emission of the OLED. For instance, a TFT layer 21 is disposed in the display area 10 and the non-display area 11, and OLEDs 23 are disposed on the TFT layer 21 in the display area 10. As illustrated in FIG. 5, the TFT layer 21 at least includes gate electrodes 211, active layers 213 and source/drain electrode layers 214 disposed on a base 30; the OLEDs 23 at least include a first electrode layer 231, a second electrode layer 233 and a plurality of organic material layers 232 formed between the first electrode layer and the second electrode layer; and the organic material layer at least includes an light-emitting layer (EML). In addition, the TFT 21 may further include an insulating layer 212 formed on the gate electrode 211, a passivation layer 215 formed on the source, drain electrode layer 214 and the active layer 213, and an insulating layer 216 formed on the passivation layer 215. The OLED 23 includes a first electrode layer 231, e.g., an anode layer, formed on the insulating layer 216, an organic function layer 232 formed on the first electrode layer 231, and a second electrode layer 233, e.g., a cathode, formed on the organic function layer 232. For instance, the OLED 23 is electrically connected with the TFT 21 via a through hole formed in the passivation layer 215 and the insulating layer 216.

In the embodiment, the method of manufacturing the display substrate includes the following steps.

Step S10: forming an auxiliary layer in the non-display area before forming the OLEDs. The auxiliary layer is made from material of which the temperature is raised after heating or which is deformed after heating or which the viscosity is reduced after heating. For instance, the performances of the auxiliary layer are changed after heating, so that a portion of the organic material layer corresponding to the auxiliary layer can be easily stripped off Step S20: removing the portion of the organic material layer corresponding to the auxiliary layer, on the auxiliary layer by a heating process after forming the OLEDs.

The method of manufacturing the display substrate further includes: forming a TFT layer 21 and forming a pixel definition layer (PDL) 22 on the TFT layer 21, before forming the OLEDs. The TFT layer 21 is formed in the display area and extended to the non-display area. In the embodiment, the auxiliary layer includes a first auxiliary layer 24 and a second auxiliary layer 25; the first auxiliary layer 24 is made from heat-absorbing material and formed below the TFT layer 21 in the non-display area 11; and the second auxiliary layer 25 is made from thermoplastic polymer material or thermal expansion material and formed on the PDL 22 in the non-display area 11.

Taking the case that the display substrate includes a TFT layer 21 provided with bottom-gate TFTs (the embodiment of the present disclosure is not limited to the bottom-gate TFTs and may also adopt top-gate TFTs) as an example, in the method of manufacturing the display substrate, a gate metal material layer 211 of forming gate electrodes and gate lines is formed on the first auxiliary layer 24 in the non-display area 11 and simultaneously formed in the display area 10 with a considerable height on the first auxiliary layer 24 (the gate electrodes are formed on portions of the gate metal material layer 211 corresponding to pixel regions and are one part of the TFT layer 21, and only for the convenience of understanding, the gate metal material layer 211 is shown in FIG. 2 independent of the TFT layer 21); and the second auxiliary layer 25 is formed on the pixel definition layer (PDL) 22 in the non-display area 11. For instance, in the method of manufacturing the display substrate provided by the embodiment, the step S10 includes the following steps.

Step S101: forming the first auxiliary layer 24 in the non-display area 11.

In this step, as illustrated in FIG. 2, the first auxiliary layer 24 is formed on the base 20. The heat-absorbing material for forming the first auxiliary layer 24 includes metal with strong heat absorptivity or metal oxide with strong heat absorptivity. For instance, the metal with strong heat absorptivity is selected from a group consisting of black titanium (silver and titanium alloy) or black chrome (formed by plating chrome on the surface of metal such as molybdenum), and the metal oxide with strong heat absorptivity is selected from a group consisting of aluminum oxide, titanium oxide, manganese oxide, copper oxide, or the like. For instance, the first auxiliary layer 24 is formed below the TFT layer 21 in the non-display area 11 by a patterning process.

Step S102: forming the TFT layer 21 in the display area 10 and the non-display area 11.

The step of forming the TFT layer 21 includes: forming patterns of gate electrodes, gate lines, active layers, source electrodes and drain electrodes. The gate metal material layer 211 is formed on the first auxiliary layer 24 and formed in the display area 10 with considerable height on the first auxiliary layer 24. In the display area 10, the gate electrodes are formed on portions of the gate metal material layer 211 corresponding to pixel regions; the gate lines are formed on boundary portions of the gate metal material layer 211 corresponding to the pixel regions; and the pattern of the active layers and the pattern of the source electrodes and the drain electrodes are formed on the gate electrodes and the gate lines in sequence. In the non-display area 11, the gate metal material layer 211 is provided with connecting lines of the gate electrodes of the TFTs and a gate driver.

Step S103: forming the PDL 22 in the display area 10 and the non-display area 11.

In this step, the PDL 22 is formed on the TFT layer 21. The PDL 22 disposed in the display area is in a shape of gridding. For instance, an OLED may be formed in each grid.

Step S104: forming the OLEDs 23.

The step of forming the OLEDs 23 includes: forming a pattern of a first electrode layer 231 disposed in the gridding of the PDL, a pattern of a second electrode layer 233 covering the PDL 22, and a pattern of an EML 232 disposed between the first electrode layer 231 and the second electrode layer 233. The first electrode layer 231 is formed on the TFT layer 21 and electrically connected with the drain electrodes of the TFTs. In addition, a package structure 30 may also be formed on the second electrode layer 233.

In this step, in the process of forming the organic material layer for forming the OLEDs 23, the organic material layer is simultaneously formed in the display area 10 and the non-display area 11 by continuous printing or a coating process, and the organic material layer disposed in the display area 10 is a pattern of organic materials for forming the OLEDs. The organic material layer includes, but not limited to, an EML and may also be a hole transport layer (HTL), an electron transport layer (ETL) or other organic material layer.

Step S105: forming the second auxiliary layer 25 in the non-display area 11.

In this step, the second auxiliary layer 25 is formed on the PDL 22 in the non-display area 11. The thermoplastic polymer material for forming the second auxiliary layer 25 is selected from a group consisting of polypropylene (PP), polyethylene (PE) and polyvinyl chloride (PVC); and the thermal expansion material is selected from a group consisting of zinc, lead, magnesium, aluminum or an alloy of at least one above metal. For instance, the second auxiliary layer is bonded to the upper part of the PDL 22 in the non-display area via a viscous medium.

Correspondingly, a display substrate is formed by the method of manufacturing the display substrate. The display substrate includes a display area 10 and a non-display area 11. The display area 10 is provided with OLEDs 23. The OLEDs 23 include patterns of organic materials. The organic material layer is simultaneously formed in the non-display area 11 and the display area 10. The organic materials in the display area 10 are used for forming the OLEDs 23. An auxiliary layer is also formed below the organic material layer in the non-display area 11.

The auxiliary layer has the following features: the performances of the auxiliary layer are changed after heating, so that the portion of the organic material layer corresponding to the auxiliary layer can be easily stripped off. The changes of the performances of the auxiliary layer after heating include: the temperature is raised after heating, or the auxiliary layer is deformed after heating, or the viscosity is reduced after heating.

The display area is divided into a plurality of pixel regions, and TFTs are disposed in the pixel regions. The TFT layer 21 includes a plurality of TFTs and it is extended to the non-display area 11. A PDL is disposed on the TFT layer 21, and the organic material layer in the display area 10 is disposed in the PDL so as to form the OLEDs 23. The auxiliary layer includes a first auxiliary layer 24 and a second auxiliary layer 25. The first auxiliary layer 24 is made from heat-absorbing material and disposed below the TFT layer 21 in the non-display area 11. The second auxiliary layer 25 is made from thermoplastic polymer material or thermal expansion material and disposed on the PDL 22 in the non-display area 11.

Correspondingly, the TFT layer 21 includes: a pattern(s) of gate electrodes and patterns of gate lines, a pattern(s) of active layers, and a pattern(s) of source electrodes and drain electrodes. Both the patterns) of the gate electrodes and the pattern(s) of the gate lines are formed by the gate metal material layer 211. The gate metal material layer 211 is disposed on the first auxiliary layer 24 and simultaneously disposed in the display area 10 with considerable height on the first auxiliary layer 24. The pattern(s) of the active layers and the pattern(s) of the source electrodes and the drain electrodes are formed on the pattern(s) of the gate electrodes and the pattern(s) of the gate lines in sequence. The PDL 22 is in a shape of gridding in the display area. The OLEDs 23 at least include: a pattern of a first electrode layer disposed in the gridding of the PDL, a pattern of a second electrode covering the PDL, and a pattern of an EML disposed between the first electrode layer and the second electrode layer. The first electrode layer is electrically connected with the drain electrodes of the TFTs. The second auxiliary layer 25 is disposed on the PDL 22 in the non-display area 11.

In the display substrate provided by the embodiment, the heat-absorbing material for forming the first auxiliary layer 24 includes metal with strong heat absorptivity or metal oxide with strong heat absorptivity. The metal with strong heat absorptivity is selected from a group consisting of black titanium (silver and titanium alloy) or black chrome (formed by plating chrome on the surface of metal such as molybdenum), and the metal oxide with strong heat absorptivity is selected from a group consisting of aluminum oxide, titanium oxide, manganese oxide, copper oxide, or the like. The thermoplastic polymer material for forming the second auxiliary layer 25 is selected from a group consisting of polypropylene (PP), polyethylene (PE) and polyvinyl chloride (PVC). The thermal expansion material is selected from a group consisting of zinc, lead, magnesium, aluminum or an alloy of at least one above metal.

In the display substrate, the organic material layer is disposed in the display area 10 and the non-display area 11, and the organic material layer disposed in the display area 10 is a pattern of organic materials for forming the OLEDs.

For the above display substrate, in the method of manufacturing the display substrate, after the step of forming the OLEDs 23 in the step S20: the display substrate is formed by removing other portions of the organic material layer, simultaneously formed with the pattern of the organic materials for forming the OLEDs 23, on the auxiliary layer by a heating process.

The heating process includes: an illuminating process (including a laser irradiation process), a thermoelastic process or a thermal ablation process.

For the first auxiliary layer 24, in the process of cleaning the organic materials by the heating process, due to the heat-absorbing action of the heat-absorbing materials, the temperature of the non-display area 11 is obviously raised, so that the organic materials on the surface of the non-display area 11 can be easily stripped off and removed, but the first auxiliary layer 24 is retained in the display substrate. For the second auxiliary layer 25, in the process of cleaning the organic materials by the heating process, due to raised temperature, deformation or poor viscosity, the second auxiliary layer 25 disposed in the non-display area 11 and the organic materials disposed on the second auxiliary layer 25 can be easily stripped off and simultaneously removed. Herein, the first auxiliary layer 24 is retained in the final finished product of the display substrate, which has the function of heat sensitivity and intensified response in the process of removing the organic material layer on the surface of a semi-finished product of the display substrate, and the difficulty in the cleaning of the substrate is reduced.

It should be understood that the auxiliary layer in the method of manufacturing the display substrate is particularly suitable for removing relatively sensitive organic materials for forming the OLEDs, but is not limited to be only used for removing the organic materials for forming the OLEDs; and meanwhile, the display substrate herein may be a display substrate unit after fragment cutting and may also be a motherboard with a plurality of display substrate units.

The method of manufacturing the display substrate is simple and easy to implement, has good effect in removing the organic materials in the non-display area 11, and clean display substrate without residual organic materials can be readily obtained.

Embodiment 2:

The embodiment provides a method of manufacturing a display substrate and a display substrate formed by the manufacturing method. Compared with the embodiment 1, in the method of manufacturing the display substrate and the display substrate formed by the manufacturing method, provided by the embodiment, the non-display area 11 is different as the first auxiliary layer 24 made from heat-absorbing material is disposed correspondingly beneath the gate metal material layer 211 in the non-display area 11.

Figure 3:
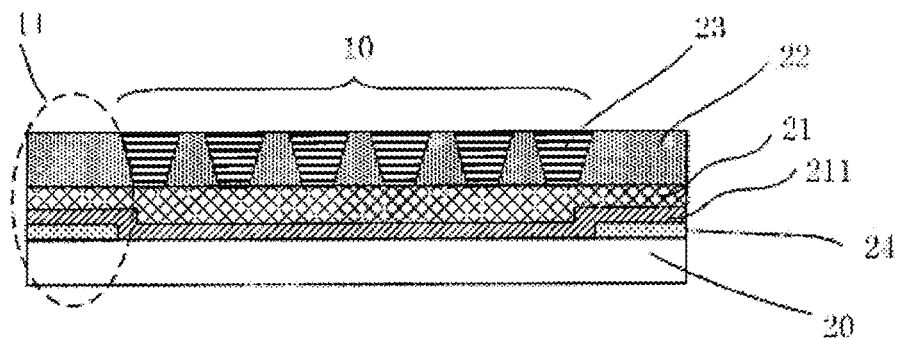
FIG. 3 is a schematic partial structural view of a display substrate provided by the second embodiment of the present disclosure.

As illustrated in FIG. 3, in the method of manufacturing the display substrate, provided by the embodiment, before the TFT layer 21 is formed, the first auxiliary layer 24 (the first auxiliary layer 24 is disposed between the base 20 and the gate metal material layer 211) is formed by heat-absorbing material, and other layer structures are not specifically shown in FIG. 3.

The material of the first auxiliary layer 24 in the embodiment is the same as that of the first auxiliary layer 24 in the embodiment 1. The first auxiliary layer 24 may be a coating with the thickness of 10 to 1,000 nm.

In the embodiment, the method of removing the organic material layer in the non-display area 11 on the display substrate is the same as that of the embodiment 1. That is to say, in the process of cleaning the organic material layer portion in the non-display area 11 by a heating process, due to the heat-absorbing action of the heat-absorbing materials in the first auxiliary layer 24, the temperature of the non-display area 11 can be obviously raised, so that the temperature difference can be formed between the non-display area 11 and the display area 10, and the organic material layer portion on the surface of the non-display area 11 can be easily stripped off and removed.

The method of manufacturing the display substrate is simple and easy to implement, which has good effect in removing the organic materials in the non-display area 11, and clean display substrate without residual organic materials can be readily obtained.

Embodiment 3:

The embodiment provides a method of manufacturing a display substrate and a display substrate formed by the manufacturing method. Compared with the embodiment 1, in the method of manufacturing the display substrate and the display substrate formed by the manufacturing method, provided by the embodiment, an auxiliary layer made from thermoplastic polymer material or thermal expansion material is only disposed on the PDL 22.

Figure 4:
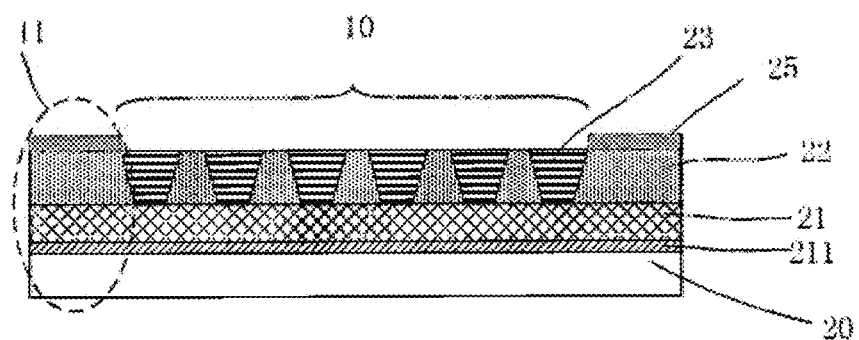
FIG. 4 is a schematic partial structural view of a display substrate provided by the third embodiment of the present disclosure.

As illustrated in FIG. 4, in the method of manufacturing the display substrate, provided by the embodiment, after the PDL 22 is formed, a second auxiliary layer 25 is formed on the PDL 22 in the non-display area 11 by thermoplastic polymer material or thermal expansion material, and other structures are not shown in FIG. 4.

The material of the second auxiliary layer 25 in the embodiment is the same as that of the second auxiliary layer 25 in the embodiment 1, and the second auxiliary layer 25 may be a coating with the thickness of 10 to 1,000 nm.

In the embodiment, the method of removing the organic material layer in the non-display area 11 on the display substrate is the same as that of the embodiment 1. That is to say, in the process of cleaning the organic material layer portion in the non-display area 11 by a heating process, as the thermoplastic polymer materials or the thermal expansion materials in the second auxiliary layer 25 will be deformed or have poor viscosity due to raised temperature in the process of heating or illumination, the second auxiliary layer in the non-display area 11 and the organic material layer portion disposed on the second auxiliary layer can be stripped of and removed.

The method of manufacturing the display substrate is simple and easy to implement, which has good effect in removing the organic materials in the non-display area 11, and a clean display substrate without residual organic materials can be readily obtained.

It should be understood herein that any method of manufacturing the display substrate provided by the embodiments 1 to 3 may be flexibly selected according to technique conditions; and one or two auxiliary layers are disposed in the semi-finished product of the display substrate, so that the organic materials, used for forming the OLEDs in the display area, formed in the non-display area can be conveniently removed in the later period. The method of manufacturing the display substrate, provided by the embodiment of the present disclosure, is particularly suitable for manufacturing the display substrate in which the organic material layer is formed by continuous printing or coating.

In the method of manufacturing the display substrate and the corresponding display substrate, provided by the embodiments 1 to 3, the auxiliary layer, made from material of which the temperature is raised after heating or which is deformed after heating or which the viscosity is reduced after heating, is disposed in the non-display area; in the process of cleaning the organic materials by a heat source, due to the auxiliary layer, there is temperature difference, deformation difference or viscosity reduction between the organic materials in the non-display area and the organic materials in the display area, so that the organic material layer in the non-display area can be easily stripped off, and the method is simple and easy to implement.

Embodiment 4:

The embodiment provides a display device, which includes the display substrate formed by any method of manufacturing the display substrate provided by the embodiments 1 to 3. In the display substrate, the first auxiliary layer therein may be retained.

In the manufacturing process, the display substrate is applicable for the manufacturing process of continuous printing or coating of organic materials. After the method of manufacturing the display substrate is adopted to manufacture the organic materials, the organic materials in the non-display area are cleaned. At this point, due to the action of the auxiliary layer, the difficulty of the cleaning process is greatly reduced compared with the currently common substrate, particularly in the process of cleaning a difficultly cleaned cathode contact area of an OLED display panel.

The display device may be any product or component with display function, such as electronic paper, an OLED panel, a mobile phone, a tablet PC, a TV, a display device, a notebook computer, a digital picture frame and a navigator.

It should be understood that the above embodiments are only exemplary implementations for demonstrating the principles of the embodiments of the present disclosure, but the embodiments of the present disclosure are not limited thereto. Variants and improvements may be made by an ordinary skill in the art without departing from the spirit and the essence of the embodiments of the present disclosure, which shall also fall within the scope of protection of the present disclosure.

The present application claims priority to the Chinese patent application No. 201510174031.3, filed Apr. 13, 2015, and entitled "Method of Manufacturing Display Substrate, Semi-Finished Product of Display Substrate and Display Device", which is incorporated herein by reference in its entirety.

What is claimed is:

1. A method of manufacturing a display substrate including a display area and a non-display area, comprising
    forming an organic material layer in the display area and the non-display area;
    forming an auxiliary layer in the non-display area before forming the organic material layer, in which performances of the auxiliary layer are changed after heating, to allow a portion of the organic material layer corresponding to the auxiliary layer being easily stripped off;
    removing the portion of the organic material layer corresponding to the auxiliary layer by a heating process;
    before forming the organic material layer, forming a thin-film transistor (TFT) layer and forming a pixel definition layer (PDL) on the TFT layer, in which the TFT layer includes a plurality of TFTs disposed in the display area and is extended to the non-display area; and the organic material layer in the display area is formed in the PDL so as to form organic light-emitting diodes (OLEDs);
    wherein the auxiliary layer includes a first auxiliary layer, and a second auxiliary layer; the first auxiliary layer is formed below the TFT layer in the non-display area by a heat-absorbing material; and the second auxiliary layer is formed on the PDL, and the TFT layer in the non-display area by a thermoplastic polymer material, or a thermal expansion material.

2. The method of manufacturing the display substrate according to claim 1, wherein the auxiliary layer is made from a material of which a temperature is raised after heating or which is deformed after heating or which the viscosity is reduced after heating.

3. The method of manufacturing the display substrate according to claim 1, wherein the forming of the TFT layer includes: forming patterns of gate electrodes, gate lines, active layers, source electrodes and drain electrodes; the gate electrodes and the gate lines are formed by a same gate metal material layer through a patterning process; and the patterns of the active layers and the patterns of the source electrodes and the drain electrodes are formed in sequence on the gate electrodes and the gate lines.

4. The method of manufacturing the display substrate according to claim 1, wherein the PDL is formed in a shape of gridding in the display area; the forming of the OLEDs at least includes: forming a pattern of a first electrode layer disposed in the gridding of the PDL, a second electrode layer covering the PDL and a pattern of a light-emitting layer (EML) disposed between the pattern of the first electrode layer and the second electrode layer; and the first electrode layer is electrically connected with the TFTs.

5. The method of manufacturing the display substrate according to claim 1, wherein the heat-absorbing material includes a metal with strong heat absorptivity or a metal oxide with strong heat absorptivity, in which the metal with strong heat absorptivity is selected from a group consisting of black titanium or black chrome, and the metal oxide with strong heat absorptivity is selected from a group consisting of aluminum oxide, titanium oxide, manganese oxide, copper oxide, or the like.

6. The method of manufacturing the display substrate according to claim 1, wherein the thermoplastic polymer material is selected from a group consisting of polypropylene (PP), polyethylene (PE) and polyvinyl chloride (PVC); and the thermal expansion material is selected from a group consisting of zinc, lead, magnesium, aluminum or an alloy of at least one above metal.

7. The method of manufacturing the display substrate according to claim 1, wherein the organic material layer is simultaneously formed in the display area and the non-display area by continuous printing or a coating process and includes at least one organic material for forming the OLEDs.

8. The method of manufacturing the display substrate according to claim 1, wherein the first auxiliary layer is formed below the TFT layer in the non-display area by a patterning process; and the second auxiliary layer is bonded to the upper part of the PDL in the non-display area via a viscous medium.

9. The method of manufacturing the display substrate according to claim 1, wherein the step of removing the portion of the organic material layer corresponding to the auxiliary layer by the heating process includes: heating the display substrate by an illuminating process, a thermoplastic process or a thermal ablation process.

10. A display substrate, comprising:
    a display area and a non-display area, wherein an organic material layer is disposed in the display area and the non-display area;
    a thin-film transistor (TFT) layer including a plurality of TFTs disposed in the display area and being extended to the non-display area; and
    a pixel definition layer (PDL) disposed on the TFT layer, in which the organic material layer in the display area is disposed in the PDL so as to form organic light-emitting diodes (OLEDs); and
    a first auxiliary layer, and a second auxiliary layer only in the non-display area of the border region of the display substrate;
    wherein the first auxiliary layer is made from a heat-absorbing material of which temperature is raised after heating and disposed below the TFT layer in the non-display area, the second auxiliary layer is made from a thermoplastic polymer material or a thermal expansion material which is deformed or which viscosity is reduced after heating and disposed on the PDL and the TFT layer in the non-display area, and configured to allow a portion of organic material layer respectively corresponding to the first auxiliary layer and the second auxiliary layer to be easily removed by a heating process.

11. The display substrate according to claim 10, wherein the TFT layer includes: patterns of gate electrodes, a gate insulating layer, patterns of active layers, patterns of source electrodes and drain electrodes, and a passivation layer; and the patterns of the active layers and the patterns of the source electrodes and the drain electrodes are disposed on the patterns of the gate electrodes in sequence.

12. The display substrate according to claim 10, wherein the PDL is in a shape of gridding in the display area; the OLEDs at least include: a pattern of a first electrode layer disposed in the gridding of the PDL, a pattern of a second electrode covering the PDL, and a pattern of an organic function layer disposed between the first electrode layer and the second electrode layer; and the first electrode layer is electrically connected with the TFTs.

13. The display substrate according to claim 10, wherein the heat-absorbing material includes a metal with strong heat absorptivity or a metal oxide with strong heat absorptivity; the metal with strong heat absorptivity is selected from a group consisting of black titanium or black chrome; and the metal oxide with strong heat absorptivity is selected from a group consisting of aluminum oxide, titanium oxide, manganese oxide, copper oxide, or the like.

14. The display substrate according to claim 10, wherein the thermoplastic polymer material is selected from a group consisting of polypropylene (PP), polyethylene (PE) and polyvinyl chloride (PVC); and the thermal expansion material is selected from a group consisting of zinc, lead, magnesium, aluminum or an alloy of at least one above metal.

15. A display device, comprising a display substrate, wherein the display substrate comprises:
a display area and a non-display area, wherein an organic material layer is disposed in the display area and the non-display area;
a thin-film transistor (TFT) layer including a plurality of TFTs disposed in the display area and being extended to the non-display area; and
a pixel definition layer (PDL) disposed on the TFT layer, in which the organic material layer in the display area is disposed in the PDL so as to form organic light-emitting diodes (OLEDs); and
a first auxiliary layer, and a second auxiliary layer only in the non-display area of the border region of the display device;
wherein the first auxiliary layer is made from a heat-absorbing material of which temperature is raised after heating and disposed below the TFT layer in the non-display area, the second auxiliary layer is made from a thermoplastic polymer material, or a thermal expansion material which is deformed or which viscosity is reduced after heating and disposed on the PDL and the TFT layer in the non-display area, and configured to allow a portion of organic material layer respectively corresponding to the first auxiliary layer and the second auxiliary layer to be easily removed by a heating process.

16. The display device according to claim 15, wherein the TFT layer includes: patterns of gate electrodes, a gate insulating layer, patterns of active layers, patterns of source electrodes and drain electrodes, and a passivation layer; and the patterns of the active layers and the patterns of the source electrodes and the drain electrodes are disposed on the patterns of the gate electrodes in sequence.

17. The display device according to claim 15, wherein the PDL is in a shape of gridding in the display area; the OLEDs at least include: a pattern of a first electrode layer disposed in the gridding of the PDL, a pattern of a second electrode covering the PDL, and a pattern of an organic function layer disposed between the first electrode layer and the second electrode layer; and the first electrode layer is electrically connected with the TFTs.

18. The display device according to claim 15, wherein the heat-absorbing material includes a metal with strong heat absorptivity or a metal oxide with strong heat absorptivity; the metal with strong heat absorptivity is selected from a group consisting of black titanium or black chrome; and the metal oxide with strong heat absorptivity is selected from a group consisting of aluminum oxide, titanium oxide, manganese oxide, copper oxide, or the like.

19. The display device according to claim 15, wherein the thermoplastic polymer material is selected from a group consisting of polypropylene (PP), polyethylene (PE) and polyvinyl chloride (PVC); and the thermal expansion material is selected from a group consisting of zinc, lead, magnesium, aluminum or an alloy of at least one above metal.

* * * * *